(12) United States Patent
Melz et al.

(10) Patent No.: US 7,876,024 B2
(45) Date of Patent: Jan. 25, 2011

(54) DEVICE AND METHOD FOR INFLUENCING VIBRATION OF A PLANAR ELEMENT

(75) Inventors: Tobias Melz, Darmstadt (DE); Dirk Mayer, Darmstadt (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 239 days.

(21) Appl. No.: 11/575,785

(22) PCT Filed: Sep. 7, 2005

(86) PCT No.: PCT/EP2005/009589

§ 371 (c)(1),
(2), (4) Date: Feb. 4, 2008

(87) PCT Pub. No.: WO2006/032363

PCT Pub. Date: Mar. 30, 2006

(65) Prior Publication Data

US 2008/0246372 A1    Oct. 9, 2008

(30) Foreign Application Priority Data

Sep. 23, 2004   (DE) .................. 10 2004 046 150

(51) Int. Cl.
*H01L 41/04* (2006.01)
*H02N 2/04* (2006.01)

(52) U.S. Cl. .................. 310/328; 310/330; 310/338

(58) Field of Classification Search ............ 310/323.01, 310/323.21, 324, 328, 330, 338, 339, 340, 310/345

See application file for complete search history.

(56) References Cited

U.S. PATENT DOCUMENTS

| 4,565,940 | A | | 1/1986 | Hubbard, Jr. |
| 5,687,462 | A | * | 11/1997 | Lazarus et al. ............. 29/25.35 |
| 6,394,655 | B1 | * | 5/2002 | Schnur et al. ................ 384/247 |
| 6,672,434 | B2 | * | 1/2004 | Schnur et al. ............ 188/266.7 |

FOREIGN PATENT DOCUMENTS

| DE | 100 42 617 A1 | 3/2001 |
| DE | 101 06 605 A1 | 8/2002 |
| EP | 0 806 589 B1 | 3/2002 |
| WO | WO 98/49567 | 11/1998 |

* cited by examiner

*Primary Examiner*—Walter Benson
*Assistant Examiner*—Derek J Rosenau
(74) *Attorney, Agent, or Firm*—Antonelli, Terry, Stout & Kraus, LLP.

(57) ABSTRACT

The invention is a device for influencing the vibration of a planar element having two opposite surfaces and a neutral fiber plane running between the two surfaces including at least one actuator and at least one sensor which each are provided with transducer materials and are connected to at least one electronic component or an electronic module. The at least one actuator and at least one sensor are completely integrated into the planar element so as to be spaced from the two surfaces as well as from the neutral fiber plane.

13 Claims, 3 Drawing Sheets

DEVICE AND METHOD FOR INFLUENCING VIBRATION OF A PLANAR ELEMENT

BACKGROUND OF THE INVENTION

1. Field of the Invention

The presents invention relates to a device and a method for influencing the vibration of a planar element having two opposite surfaces and a neutral fiber plane running between the two surfaces, at least one actuator and at least one sensor, which each are provided with transducer materials and are connected to an electronic component or an electronic module. Preferably a printed circuit board can be used as the planar element.

2. Description of the Prior Art

Devices for influencing mechanically vibrating planar elements are employed in numerous technical fields, for example in acoustics, in the automobile industry and in the air and space industry.

The increasing interconnection of classical mechanical engineering and information technology, especially in the disciplines of mechatronics and adaptronics, is leading to an increasing use of electronic modules on printed circuit boards, for example in the fields of automobile manufacturing, in the air and space industry but also in machine tool manufacturing. Excitation of resonance in the circuit board leads to elastic deformations which can result in considerable elongation and buckling along the surface of the printed circuit board, thereby burdening the strip conductors on the surface and the applied electronic components. Tearing or damaging of the conductor strips can lead to damaging the printed circuit board itself, soldering and other connections may fail. Applied components may be damaged by the mechanical tensions or lead to failure of the electronic module. Consequently, there is a need for dampening such type vibrations in the electronic modules.

State of the art are passive devices for influencing vibration of planar elements, for example by means of a special construction design, such as mechanical stiffening in the form of bracing or by using vibration-dampening materials in the respective planar elements. Apart form this, there are state-of-the-art devices which result in mechanical decoupling the vibrations of planar elements from their surroundings, for example by using suited holding means.

Due to their efficiency, such type passive devices for influencing vibration find wide use for dampening undesired mechanical vibrations. A drawback is, however, the required additional space and additional weight. Moreover, the efficacy of influencing vibration is dependent on the to-be-influenced vibration frequency. In general, efficacy decreases distinctly at low frequencies, consequently it is impossible to employ passive systems for applications below frequencies of a few hundred Hz.

State-of-the-art alternative methods for influencing the vibration of planar elements use active systems usually having at least one sensor and one actuator which are connected to a control unit, and the sensor and the actuator are actively connected to the planar element. In general, the mentioned components form a control circuit which permits controlling the actuator in a defined manner based on the signals detected by the sensor. The sensor detects directly or indirectly the amplitude, the frequency and the phase position of the vibrations of the planar elements. Should, for example, the present vibrations of a planar element be dampened, control signals having a certain phase position, frequency and amplitude relative to the sensor signal are conveyed to the actuator by means of which counter vibrations are induced in the planar element that compensate the vibrations of the planar element. The actuator can also be utilized to excite and reinforce defined vibrations of a planar surface or to introduce defined shear, pressure or tensile forces on the planar element.

Piezoelectric transducers have proven to be particularly well suited as actuators for influencing the vibration in thin planar elements. Thus such type actuators having various piezoelectric materials in various shapes and sizes particularly in the form of planar piezoelectric transducers are used. Employed as sensors are various components such as acceleration recorders, wire strain gauges or piezoelectric transducers as well. The advantage of using transducer materials for influencing the vibration of planar elements is, among other things, the low weight and small size as well as being able to use them at vibration frequencies from several Hertz to a few kilohertz.

U.S. Pat. No. 4,565,940 describes a generic device in which an actuator is used which is an organic polymer with piezoelectric properties. Such types of polymers, such as for example polyvinylidenefluoride ($PVF_2$) are usually made in the form of foils. In the described device, a $PVF_2$ foil is placed on a surface of a planar element acting as a piezoelectric actuator. Used as sensors are acceleration meters or wire strain gauges which are also placed on the surface of the planar element. With the piezoelectric foil actuator placed on only one side of the planar element not only bending moments but also longitudinal forces are conveyed into the planar element. As the two effects overlap, the efficacy of the active influencing of vibration, however, is unfavorably influenced.

In order to solve this problem, EP 0 806 589 proposes, apart from applying a piezoelectric actuator on the surface of a planar element, attaching an acceleration sensor which records the vibrations and which is attached to the free surface of the actuator. The actuator and the sensor attached to it are placed on the surface of the planar element in such a manner that the actuator and the sensor are placed basically in the maximum vibration bulge formed with resonant excitation of the planar element. This device however has the drawback that due to the arrangement of the actuator and the sensor attached to it, parts of the surface of the planar element are no longer available for other uses.

Moreover, EP 0 975 981 describes a printed circuit board arrangement with active vibration dampening in which the actuators are placed on supporting elements in order to have as much area as possible of the printed circuit board available for the actual electronics. Being placed on supporting elements, however, renders the actuators susceptible to damage. Furthermore, it makes selective introduction of actuator forces into the planar elements more difficult.

All active devices for influencing vibration of a planar element require power electronics to trigger the actuator and/or the sensors.

The prior art devices and methods for influencing vibration of a planar element, in particular for a printed circuit board, in which actuators and/or sensors are used have the following disadvantages:

The actuators and sensors are directly or indirectly attached on the surface of the planar element, covering it at least partly. The area required for this is lost for other uses, for example for further electronic components. Moreover, the actuators and sensors disposed on the surface are exposed making them susceptible to damage from external influences, in particular if the actuators or sensors are placed on supporting elements.

By placing the actuators and sensors on only one side of the surface of the planar element, not only bending moments but also longitudinal forces are introduced respectively recorded. The overlapping of the two effects impairs the efficacy of active influencing of vibration.

The actuators and/or sensors are used inside an electrical control circuit. Triggering the actuators and/or sensors requires power electronics, consuming additional electric energy.

SUMMARY OF THE INVENTION

The present invention is a device and a method for influencing the vibration of a planar element, preferably in the form of a printed circuit board, having at least one actuator and at least one sensor which each are provided with transducer materials in such a manner that no area is lost due to the use of actuators or sensors on the surface of the planar element. Furthermore, for the most part only bending vibrations inside the planar element should be detectable and selectively influenceable. Moreover, it should be possible to influence the vibration of the planar element without requiring power electronics.

The invention influences the vibration of a planar element, having two opposite surfaces and a neutral fiber plane running between the two surfaces, with at least one actuator and at least one sensor, which are each provided with transducer materials, including the actuator and the sensor being completely integrated in the planar element at a distance from the two surfaces as well as from the neutral fiber plane.

The neutral fiber plane designates the entirety of all points inside a planar element in which no tensile stress or pressure stress occurs when the planar element is bent, that is when bending stress is introduced, for example due to mechanical vibrations of the planar elements, there is exactly one layer plane that is neither expanded nor buckled in the planar element and therefore does not change its longitudinal extension. In a planar element made of a homogeneous material, the neutral fiber plane runs through the centers of mass of the cross sections of the planar element.

There are only few areas inside the planar element, which are at a distance from the surface as well as from the neutral fiber plane that are suited for complete insertion of sensors and actuators in the planar element according to the present invention, because pressure stress and tensile stress that are detectable by the sensors only occur in these areas. Thus, an actuator can only introduce tensile stress and pressure stress in the planar element in these areas due to which bending moments can be selectively placed in the planar element. The generated pressure stress and tensile stress inside the planar element increase proportionally with greater distance of the neutral fiber plane to the surface while assuming linear elastic properties of the planar element material in accordance with Hooke' law. The actuators and the sensors, which are designed as piezoelectric transducers, are therefore more efficient if they are integrated as close as possible to the surface.

In contrast to placement of the actuators or sensors on the surface of the planar element, in which only shear forces can be conveyed via such a prior art connection, due to complete enclosure of the inserted piezoelectric transducer by the planar element material, actively induced or passively experienced longitudinal transducer changes are conveyed to the planar element material as tensile forces and pressure forces. The tensile forces and pressure forces permit direct introduction and detection of bending moments inside the planar element, which improves the efficacy of the sensors or actuators considerably.

The device of the invention for influencing the vibration of a planar element can be employed to excite vibration as well as to dampen vibration. Active, semi-passive and semi-active embodiments are possible.

In the active embodiment of the device of the invention bending vibrations of the planar element generate electric signals in the sensor which are dependent on the amplitude, the frequency and the phase position of the bending vibration. The sensor is electrically connected to a control unit. The electric signals generated by the sensor are conveyed to the control unit in the form of electrical signals. In the control unit the electrical signals are evaluated and based on them electrical control signals are generated for the actuator. The actuator is thus connected to the control unit. Sensor, control unit and actuator thus form a control circuit. Depending on the application, the actuator integrated in the planar element according to the present invention can be excited with a certain amplitude, frequency and phase position, for example to alter its longitudinal extension so that pressure stress and tensile stress are generated in the planar element, which cause antiphase bending vibrations relative to the vibrations present in the vibrations and in this manner dampen the present vibrations of the planar element. On the other hand, defined pressure stress and tensile stress which excite or amplify the defined bending vibrations of the planar element can be introduced into the planar element by the actuator in this manner.

In a semi-passive preferred embodiment of the invention, piezoelectric transducers are placed in the planar element as actuator and/or sensor and are connected to at least one suited resistive component or one such module. The action of this embodiment of the device can be described by looking at the energy. Due to the pressure forces and tensile forces occurring in the planar element, which for their part act on the piezoelectric transducer, the mechanical vibration energy of the planar element is converted by the piezoelectric transducer into electric energy. Due to the connection of the piezoelectric transducer to a resistive component, the electrical energy is converted for its part by the resistive component into thermal energy. In this manner, energy is removed from the mechanical vibration system. As the energy of a vibrating system is dependent on the amplitude of the vibration, energy withdrawal leads to a reduction of amplitude and therefore to a dampening of vibration.

In the semi-active preferred embodiment of the invention for influencing vibration of a planar element, the piezoelectric transducers are integrated in the planar element according and are connected to at least one suited inductive component or an active circuit which simulates such type components. Due to the capacitive properties of the piezoelectric transducers and their connection to at least one inductive component, an electric oscillating circuit develops. The electrical charges generated in the piezoelectric transducer by the vibrations of the planar element oscillate back and forth between the inductive component and the piezoelectric transducer. Thus there is a periodic exchange between magnetic and electric energy so that an excited vibration system with two degrees of freedom is present in which the so-called tilger effect (annihilation effect) sets in, which at the so-called tilger frequency (annihilation frequency) leads to a dampening of vibration by means of the piezoelectric transducer and in this manner to a dampening of the vibration of the planar element. Advantageous is, in particular, that no power electronics are required so that all the components required therefor can be integrated together with the piezoelectric transducer in the planar element, respectively in the printed circuit board.

BRIEF DESCRIPTION OF THE DRAWINGS

The present invention is made more apparent in the following, without the intention of limiting the scope or spirit of the overall invention, using a preferred embodiment with reference to the accompanying drawings without the intention of limiting the scope or spirit of the overall inventive idea.

DESCRIPTION OF THE PREFERRED EMBODIMENTS

The invention for influencing the vibration of a planar element and the method of carrying it out are suited, in particular, for dampening bending vibrations in printed circuit boards.

In general, printed circuit boards are not made of homogeneous material, but rather of composite materials, in particular fiber composite materials containing glass fibers. The thickness of such printed circuit boards is usually between 1 to 5 mm with usually a maximum areal dimensions of less than 2500 cm². Due to their being made of a variety of materials, printed circuit boards are, therefore, very well suited for integrating correspondingly thin piezoelectric transducers.

In the actuators and sensors integrated in the planar element according to the present invention, piezoelectric transducers are employed that are planar in design, with an areal size of up to 14 cm² and a thickness of between 0.1 and 0.4 mm. They are provided with electrodes for supplying electrical power and are distinguished, in particular, in that if an electrical voltage is applied to the electrodes, the planar piezoelectric transducer undergoes a change in length due to the piezoelectric effect, whereas any change in the transducer's thickness is negligible. The shape of the planar transducer and the shape of the electrodes can generate degrees of freedom permitting the control and the efficacy for influencing vibration to be adjusted and optimized.

Figure 1:
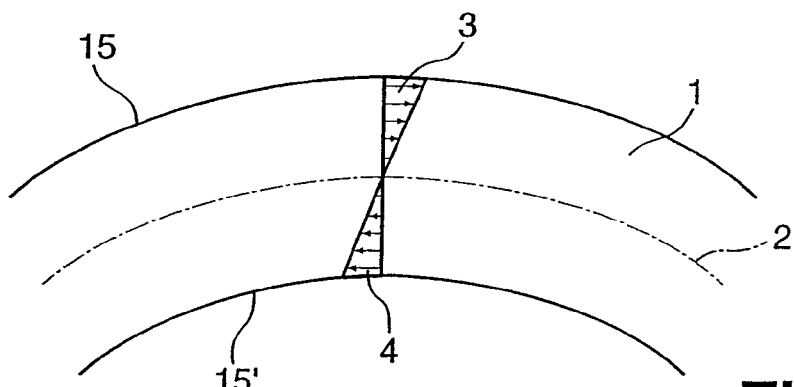
FIG. 1 shows a schematic cross section of a vibrating printed circuit board to illustrate the occurring bending moments, tensile stress and pressure stress as well as the neutral fiber plane.

To illustrate the commonly known mechanical tension conditions inside a printed circuit board in the case of bending vibrations, FIG. 1 shows a schematic cross section of a bent printed circuit board 1. The bending vibrations that cause the circuit board to bend as illustrated include a component of vibrations perpendicular to the opposite surfaces 15 and 15' of the planar element circuit board 1. The depicted bending of the printed circuit board 1 generates tensile forces 3 in the upper half of the cross section which lead to extending the printed circuit board materials and pressure forces 4 in the lower half of the cross section which lead to buckling of the printed circuit materials. The resulting pressure forces 4 and tensile forces 3 increase in the direction of the two surfaces 15, 15' and disappear at the neutral fiber 2. The tensile forces 3 and pressure forces 4 cause bending stress on a planar element located vertically above the neutral fiber plane 2 and generate in this manner a torque on the neutral fiber 2.

If a planar piezoelectric transducer is integrated in the printed circuit board according to the present invention in such a manner that it is disposed parallel to the neutral fiber plane and at a distance from the neutral fiber plane and the surface, the respective tensile forces and pressure forces of the surrounding material act on the transducer. If the piezoelectric transducer is elongated by tensile forces or shortened by pressure forces, charges are generated on the surface of the transducer and in this manner provide tappable voltages on the electrodes of the transducer. On the other hand, a piezoelectric transducer integrated according to the present invention to which an electric voltage is applied undergoes a change in length due to which the tensile forces and the pressure forces which are parallel to the neutral fiber plane are transferred to the material surrounding the piezoelectric transducer, generating thereby bending moments.

Figure 2:
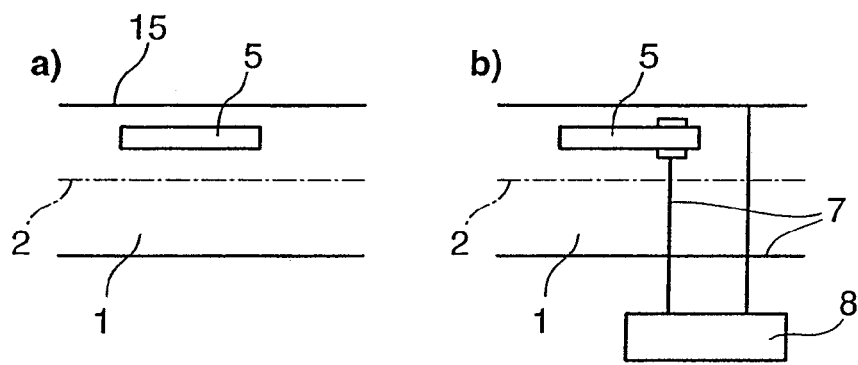
FIGS. 2a-b show a schematic cross section of a printed circuit board to illustrate the present invention and the use of a piezoelectric transducer in a planar element.

FIG. 2a shows an integration according to the invention of only one piezoelectric transducer 5 in a printed circuit board 1, with the transducer 5 being disposed parallel to the neutral fiber plane 2 and at a distance from the surface 15 and the neutral fiber plane 2.

FIG. 2b shows a device according to the invention with a piezoelectric transducer 5 in which the transducer 5 is connected to a control unit 8 by electrical connections 7 which trigger the transducer 5 as a sensor and as an actuator. Using a measuring bridge permits splitting the piezo electrical signal into an actuator part as well as a sensory part in such a manner that a single piezoelectric transducer is operable as a sensor as well as an actuator.

A piezoelectric transducer 5 in accordance with the invention in the printed circuit board 1 results in that not only are bending moments but also longitudinal forces are introduced into and respectively detected in the printed circuit board 1. Due to the overlapping of the two effects, vibration is unfavorably influenced. The problem of overlapping introduction of bending moments and longitudinal forces is such that a sensor collocated to an actuator measures not only causes bending elongation but also longitudinal extension. The latter causes, among other things, a very strong signal at the sensor but is not the object of the vibration control. Thus the control circuit predominantly controls a dimension that is not of interest. Minimizing the sensor signal, therefore has nothing to do with reducing bending vibration.

Demands on the control unit can be considerably reduced and the efficacy of influencing vibration can also be raised by integrating at least two piezoelectric transducers in the printed circuit board.

Figure 3:
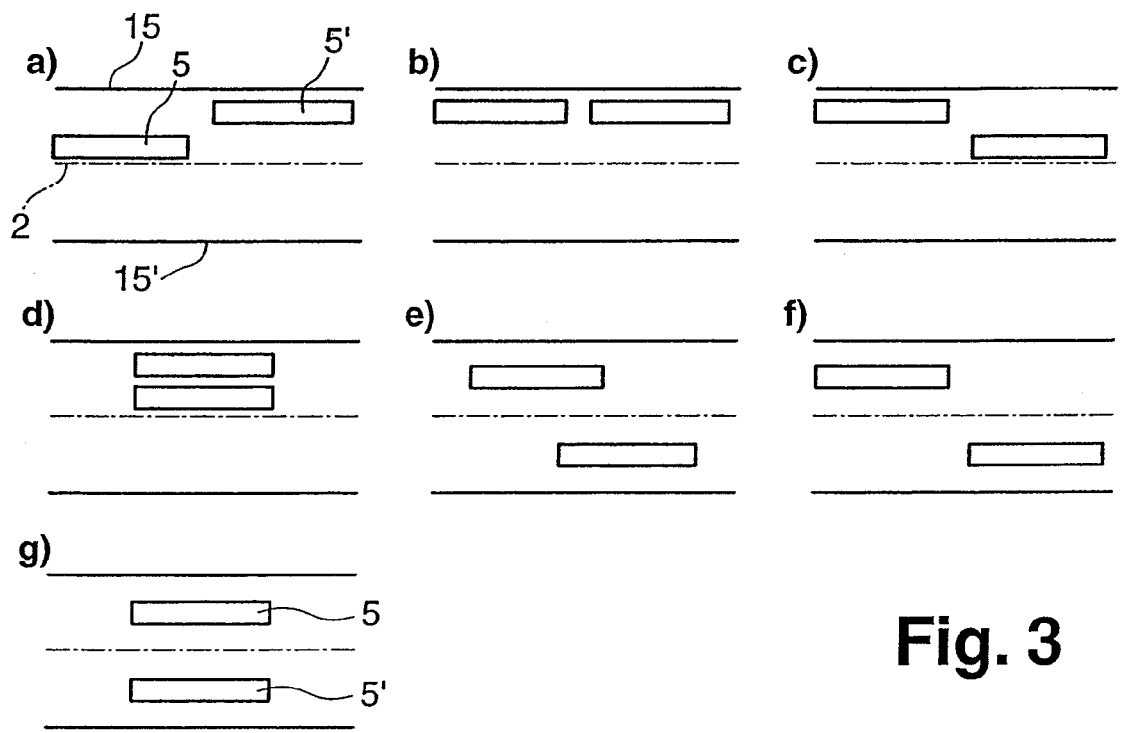
FIGS. 3a-g show a schematic cross section of a printed circuit board to illustrate various invented arrangements of an actuator and a sensor, or of two actuators, or of two sensors in a planar element in accordance with the invention.

FIGS. 3a to g show schematic cross sections of a printed circuit board 1 to illustrate various arrangements of the invention of two piezoelectric transducers 5 disposed parallel to the neutral fiber plane. For reasons of clarity, the reference numbers are only given in FIG. 3a and are analogously applicable to the other FIGS. 3b to 3g. FIGS. 3a to 3d show arrangements in which two transducers 5,5' are disposed in a half-space of the printed circuit board 1 between the neutral fiber plane 2 and a surface 15 of the printed circuit board 1, with:

FIG. 3a shows two transducers 5,5' which are disposed not to be overlapping at different distances from the neutral fiber plane 2;

FIG. 3b shows two transducers 5,5' which are disposed not to be overlapping at the same distance from neutral fiber plane 2;

FIG. 3c shows two transducers 5,5' which are disposed not to be partially overlapping at different distances from the neutral fiber plane 2;

FIG. 3d shows two transducers 5,5' which are disposed to be overlapping at different distances from the neutral fiber plane 2;

FIGS. 3e to 3g show arrangements of two transducers 5,5' which are disposed each in different half-spaces of a printed circuit board 1, which are separated by the neutral fiber plane 2, with:

FIG. 3e showing two transducers 5,5' which are disposed to be partially overlapping in a perpendicular orientation relative to the neutral fiber plane 2;

FIG. 3f showing two transducers 5,5' which are disposed to not be overlapping in a perpendicular orientation relative to the neutral fiber plane 2; and FIG. 3g shows two transducers 5,5' which are disposed to be completely overlapping in a perpendicular orientation relative to the neutral fiber plane 2.

Further variations are found in the arrangements in FIGS. 3e to 3g using different or the same distances of the two transducers 5,5' from the neutral fiber plane 2.

Of all the possible arrangements shown in FIGS. 3a to 3g, the arrangement of two transducers 5,5' in FIG. 3g is best suited for dampening the vibration of a printed circuit board 1 if the transducers are electrically connected to a control unit 8 by means of which the transducers can be operated as sensors as well as actuators. The two actuators 5,5' are each disposed, to be completely overlapping, in a perpendicular orientation relative to the neutral fiber plane 2 and preferably are integrated in the printed circuit board 1 at a position which coincides with the maximum vibration bulge produced by a resonate vibration excitation of the printed circuit board.

The other arrangements FIGS. 3e and 3f in which the two transducers 5, 5' are disposed which do not overlap relative to the neutral fiber plane 2 lead to greater demands on the control circuit 8 to reach the desired influence of vibration.

Figure 4:
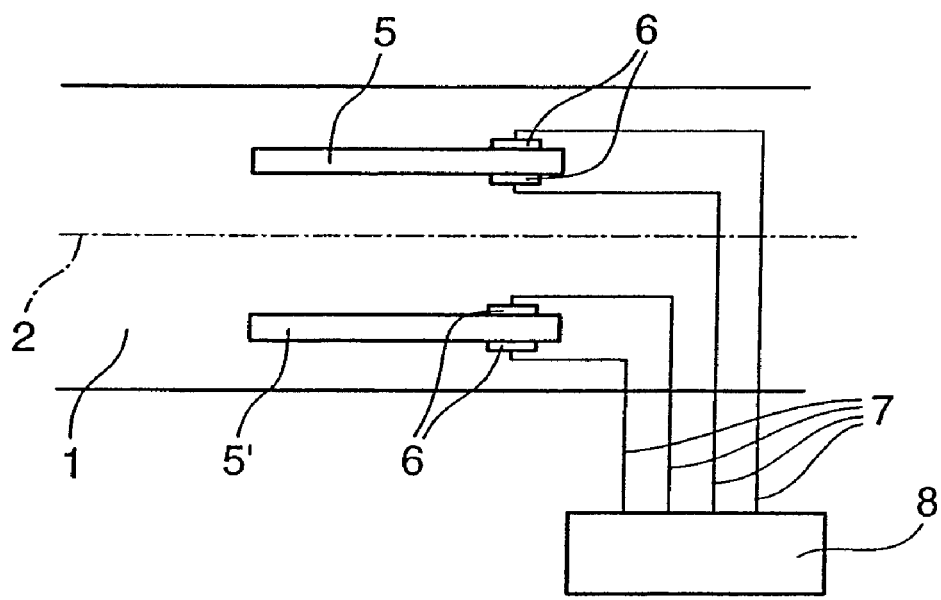
FIG. 4 shows a schematic cross section of a printed circuit board to illustrate the arrangement of two piezoelectric transducers which are triggered by a control unit as an actuator and are also used as a sensor to detect vibrations of the planar element.

FIG. 4 shows schematically a preferred embodiment of the invention with two piezoelectric transducers 5, 5' in an arrangement according to FIG. 3g. The planar piezoelectric transducers 5, 5' are each provided on their surfaces with electrode contacts 6 which are connected via electrical connections 7 to a corresponding control unit 8. The control unit 8 regulates the transducers 5, 5' in the described manner.

Figure 5:
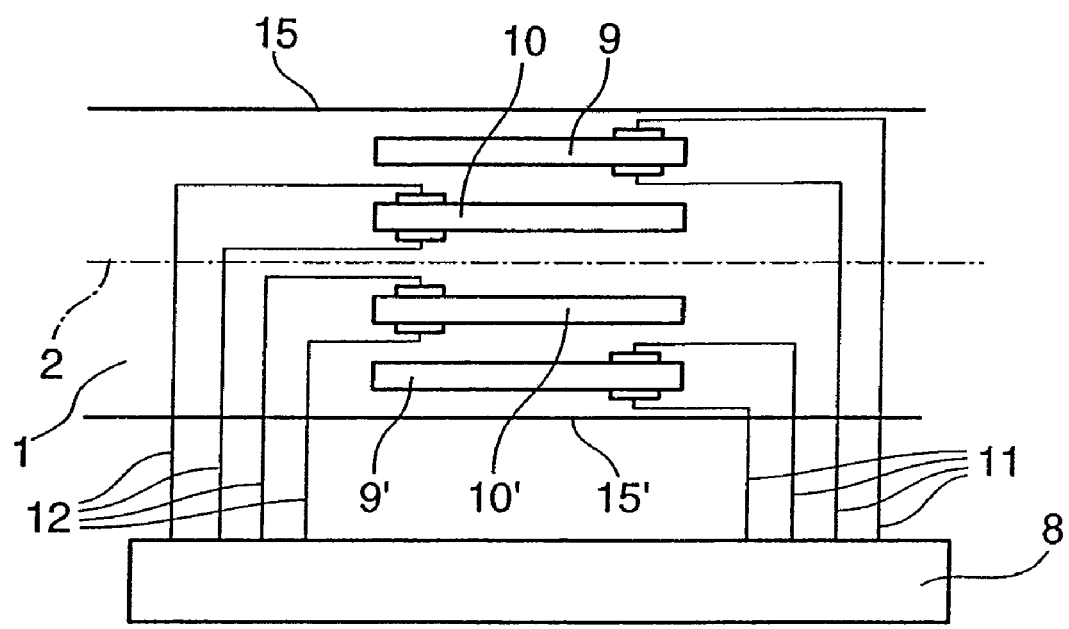
FIG. 5 shows a schematic representation of a control circuit comprising an arrangement of two pairs of actuators-sensors in the planar element and the connection to a control unit.

FIG. 5 shows schematically another advantageous further development of the device. In this case two pairs of actuators-sensors 9, 10, 9', 10' are provided, each having one actuator 9, 9' and one sensor 10,10' and each positioned between a surface 15, 15' and the neutral plane 2 in such a manner that the actuator 9, 9' and the sensor 10, 10' are oriented to overlap each other, be parallel to the neutral plane 2 and perpendicular relative to the neutral fiber plane 2. The two pairs of actuators-sensors are integrated symmetrically to the neutral fiber plane 2 in the printed circuit board 1. The sensors are connected to a control unit 8 via the electrical connections 12 and the actuators are connected via the electrical connections 11. Antiphase triggering of the actuators 9, 9' by the control unit 8 compensates for the introduction of longitudinal forces in the printed circuit board 1 whereas the magnitude of the introduced bending moment is doubled. In order that the sensors 10, 10' solely detect bending vibrations, either the difference between the two sensor signals is formed via an external connection or one of the sensors 10, 10' is reversed with reference to its polarization direction, that is integrated so as to be turned 180° in relation to the other sensor in the printed circuit board 1, due to which the latter's output voltage is in antiphase with the same deformation. Parallel connection from the two sensors 10, 10' ultimately leads to neutralizing the charges generated by the longitudinal extension of the printed circuit board 1, with the charges generated by the bending vibrations of printed circuit board 1 accumulating. The advantage of this preferred embodiment is solely influencing the bending vibration of the printed circuit board 1.

Figure 6:
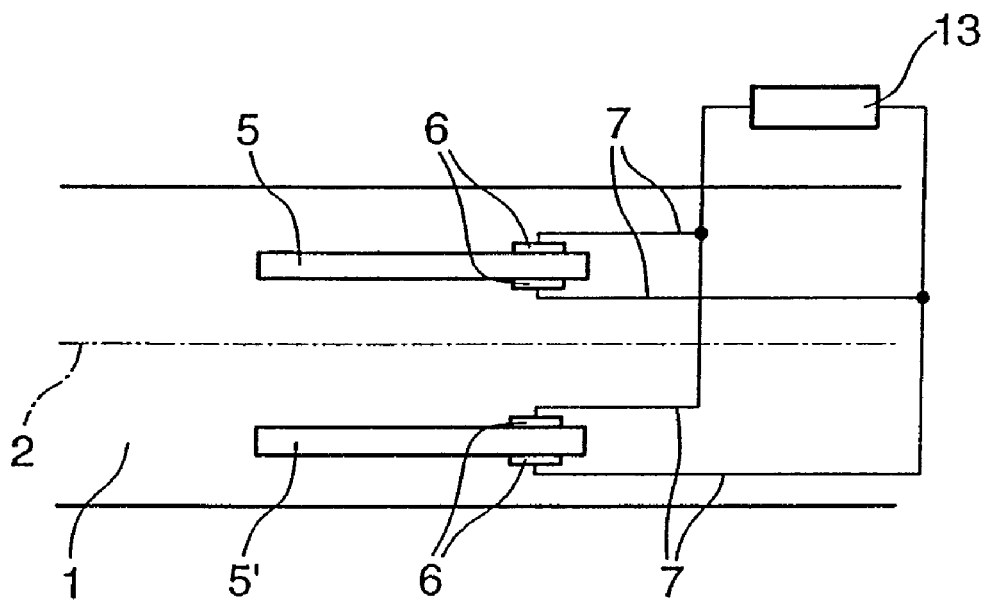
FIG. 6 shows a schematic representation of a semi-passive preferred embodiment of the present invention having a connection of a piezoelectric transducer to a resistive component.

In a semi-passive further embodiment of the invention according to FIG. 6, two piezoelectric transducers 5, 5' are integrated in the printed circuit board, are overlapping and are symmetrical to the neutral fiber. The electrodes 6 of the transducers 5, 5' are connected via electric connections 7 to a resistive component 13 or an active circuit which simulates such a component. If the printed circuit board 1 vibrates, the mechanical vibration energy of the printed circuit board 1 is converted initially with the direct piezoelectric effect in the two transducers 5, 5' into electrical energy which then is converted via the resistive component 13 into heat. Bending the printed circuit board 1, for example upward, during vibration elongates the transducer 5 integrated above the neutral fiber plane 2, whereas the transducer 5' integrated below the fiber plane 2 buckles. The opposite changes in the longitudinal extension of the transducer 5, 5' and the charges, and electrical voltages, generated on the surfaces of transducers 5, 5' thereby are connected, as shown in FIG. 6, to the resistive component 13. In this manner energy that the resistive component 13 converts into thermal energy is removed from the mechanical vibration of the printed circuit board 1. This leads to a so-called semi-passive dampening of the vibrations of the printed circuit board 1.

Figure 7:
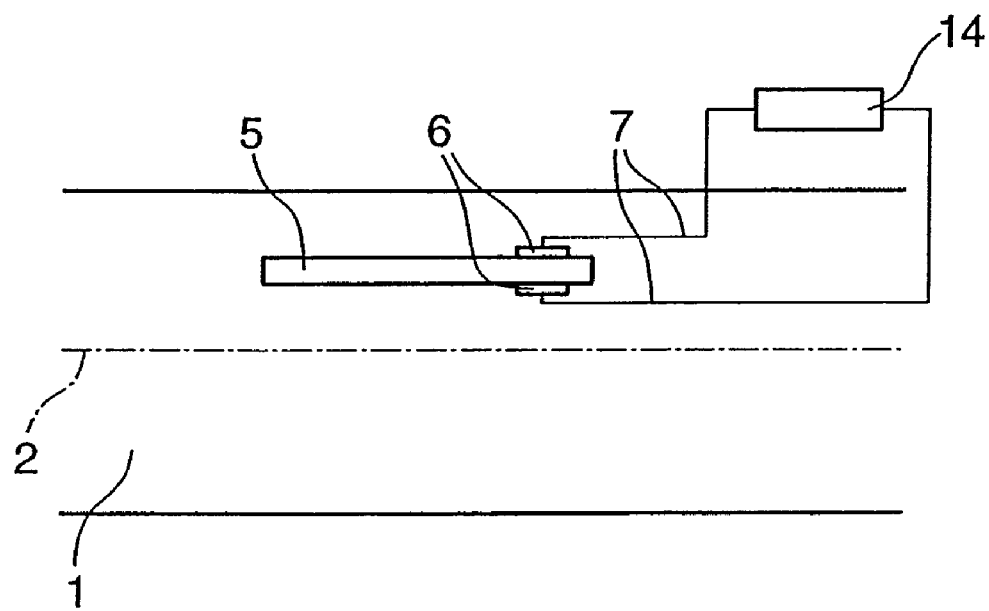
FIG. 7 shows a schematic representation of a semi-passive preferred embodiment of the present invention having a connection of a piezoelectric transducer to an inductive component.

In a semi-active further development of the invention according to FIG. 7, a piezoelectric transducer 5 integrated in the printed circuit board 1 is connected to its electrodes 6 via the electrical connections 7 to an inductive component 14 or an active circuit which simulates such a component. With this electrical circuitry, an electrical oscillating circuit is created by the capacitative properties of the transducer 5 in connection with the inductive component 14. Dampening of the mechanical vibration of the printed circuit board 1 is generated by exploiting the already described tilger effect.

Both semi-passive and semi-active dampening do not require power electronics. Consequently, it is obvious to integrate the necessary components for connecting the piezoelectric transducers together with the components present in the printed circuit board.

LIST OF REFERENCES 1 printed circuit board, planar element
2 neutral fiber, neutral fiber plane
3 tensile forces
4 pressure forces
5, 5' piezoelectric transducers
6 contact electrode on the surface of a piezoelectric transducer 7 electrical connection
8 control unit
9, 9' piezoelectric transducers as actuators
10, 10' piezoelectric transducers as sensors
11 electrical connection between actuator and control unit
12 electrical connection between sensor and control unit
13 resistive component
14 inductive component
15, 15' surface of a planar element, and a printed circuit board

What is claimed is:

1. A device for dampening bending vibrations of a planar element which include vibrations perpendicular to opposite surfaces of the planar element comprising:
 a neutral plane running between the opposite surfaces, at least one actuator and at least one sensor, the at least one actuator and the at least one sensor each including transducer materials, at least one electronic component coupled to the transducer materials, the transducer materials being controlled to elongate and/or shorten to dampen the bending vibrations perpendicular to the neutral plane; and wherein
 the at least one actuator and the at least one sensor are integrated within the planar element, are separated from the two surfaces and are separated from the neutral plane with the neutral plane comprising points inside the planar element in which no tensile stress or pressure stress occurs when the planar element is bent perpendicular to the opposite surfaces.

2. A device according to claim 1, wherein:
 a distance of the at least one actuator from one of the two surfaces is smaller than a distance of the at least one actuator from the neutral plane.

3. A device according to claim 1, comprising:
 at least two actuators which are integrated symmetrically in the planar element relative to the neutral plane.

4. A device according to claim 1, comprising:
 at least two sensors which are integrated in the planar element symmetrically relative to the neutral plane.

5. A device according to claim 1, comprising:
 at least two pairs of actuators and sensors which each pair including one actuator and one sensor and which are each disposed between one of the two surfaces and the neutral plane so that the actuators and the sensors are spaced from the neutral plane, are each parallel to the neutral plane and at least partially overlap; and wherein
 the at least two pairs of actuators and sensors are integrated symmetrically to the neutral plane in the planar element.

6. A device according to claim 1, wherein:
 the at least one actuator and the at least one sensor are piezoelectric transducers.

7. A device according to claim 1, wherein:
 the at least one actuator and the at least one sensor are planar, have an areal size of up to 14 cm$^2$ and have an areal thickness of between 0.1 and 0.4 mm.

8. A device according to claim 1, wherein:
 the at least one actuator and the at least one sensor are in a single module which is a piezoelectric transducer.

9. A device according to claim 1, comprising:
 a module connected to a control unit for controlling the module to operate alternately or simultaneously as an actuator and as a sensor.

10. A device according to claim 1, wherein:
 the planar element is an electrical printed circuit board.

11. A device according to claim 10, wherein:
 the electrical printed circuit board comprises a fiber-reinforced-composite material comprising a glass-fiber-reinforced plastic.

12. A device according to claim 1, wherein:
 the at least one sensor and the at least one actuator are connected to a control unit for controlling elongation and shortening of the transducer materials.

13. A device according to claim 1, wherein:
 the at least one sensor or at least one actuator are connected to at least one inductive or resistive electrical component.

* * * * *